US011764184B1

(12) United States Patent
Lai et al.

(10) Patent No.: US 11,764,184 B1
(45) Date of Patent: Sep. 19, 2023

(54) CHIP PACKAGING DEVICE, CHIP PACKAGING METHOD, AND PACKAGE CHIP

(71) Applicant: HOSIN GLOBAL ELECTRONICS CO., LTD, Shenzhen (CN)

(72) Inventors: Chen-Nan Lai, Shenzhen (CN); Yisheng Wu, Shenzhen (CN)

(73) Assignee: HOSIN GLOBAL ELECTRONICS CO., LTD, Shenzhen (CN)

( * ) Notice: Subject to any disclaimer, the term of this patent is extended or adjusted under 35 U.S.C. 154(b) by 0 days.

(21) Appl. No.: 18/300,379

(22) Filed: Apr. 13, 2023

(30) Foreign Application Priority Data

Sep. 1, 2022 (CN) .......................... 202211065246.8

(51) Int. Cl.
*H01L 23/00* (2006.01)

(52) U.S. Cl.
CPC .............. *H01L 24/77* (2013.01); *H01L 24/27* (2013.01); *H01L 24/35* (2013.01); *H01L 24/40* (2013.01); *H01L 24/50* (2013.01); *H01L 24/75* (2013.01); *H01L 24/79* (2013.01); *H01L 24/83* (2013.01); *H01L 24/84* (2013.01); *H01L 24/86* (2013.01); *H01L 2224/40229* (2013.01); *H01L 2224/7755* (2013.01); *H01L 2224/77252* (2013.01); *H01L 2224/84203* (2013.01); *H01L 2924/40* (2013.01)

(58) Field of Classification Search
CPC ....... H01L 24/43; H01L 24/745; H01L 24/78; H01L 24/50; H01L 24/86; H01L 24/79; H01L 24/83; H01L 24/75; H01L 24/27; H01L 24/84; H01L 24/77; H01L 24/35
See application file for complete search history.

(56) References Cited

FOREIGN PATENT DOCUMENTS

| CN | 111524918 A | 8/2020 |
|---|---|---|
| CN | 112530929 A | 3/2021 |
| JP | 2007294781 A | 11/2007 |
| JP | 2016127174 | 7/2016 |

*Primary Examiner* — David A Zarneke (57) ABSTRACT

The present disclosure provides a chip packaging device, a chip packaging method, and a package chip, and is related to a technical field of chip packaging. The chip packaging device includes conductive sheets, a vacuum suction movable assembly defining a variable suction surface, and a heating assembly. The variable suction surface sucks the plurality of conductive sheets. A first end of each of the conductive sheets is disposed above a corresponding bonding pads. A second end of each of the conductive sheets is disposed above a corresponding welding pin, so that when the variable suction surface is pressed down, the first end of each of the conductive sheets is pressed onto the corresponding bonding pad, and the second end of each of the conductive sheets is pressed onto the corresponding welding pin. The heating assembly heats solders on the bonding pads and the welding pins.

8 Claims, 7 Drawing Sheets

CHIP PACKAGING DEVICE, CHIP PACKAGING METHOD, AND PACKAGE CHIP

TECHNICAL FIELD

The present disclosure relates to a technical field of chip packaging, and in particular to a chip packaging device, a chip packaging method, and a package chip.

BACKGROUND

Due to characteristics of high reliability, convenience, and ease of operation, the packaging process has been used more and more widely since it came on the scene. As requirements for chip heat dissipation become higher and higher, packages for a chip are required to become thinner and thinner. Specifically, package substrates are gradually developing towards ultra-thin and small-scale intensification. For the substrate packaging process, how to improve a packaging capacity of ultra-thin substrates is an important issue.

In the semiconductor packaging industry, wire bonding refers to use of thin metal wires to achieve electrical interconnection between a chip and a substrate, by using heat, pressure, and ultrasonic energy, to tightly weld metal leads to the bonding pads of the substrate. Under ideal control conditions, electron sharing or atomic diffusion occurs between the metal leads and the substrate, resulting in atomic-level bonding between different metals. At present, a conventional chip package device adopts positive assembly to bond the bonding pads of the substrate to be packaged by bonding the metal leads. When performing such lead bonding method, metal leads of the chip are bonded to the bonding pads of the substrate one by one. Thus, packaging efficiency is low, and a bonding process thereof is prone to warping of the metal leads, cracking of the chip, and so on.

SUMMARY

The present disclosure provides a chip packaging device, a chip packaging method, and a package chip to solve technical problems that a conventional chip packaging adopts lead bonding method to realize electrical interconnection between a chip and a substrate, resulting in a low packaging efficiency, and resulting in warping of the metal leads, cracking of the chip, etc. during a bonding process.

In a first aspect, the present disclosure provides a chip packaging device configured to bond solders on bonding pads of a substrate one to one to solders on welding pins of at least one chip. The chip packaging device comprises a plurality of conductive sheets, a vacuum suction movable assembly, and a heating assembly.

The vacuum suction movable assembly defines a variable suction surface. The variable suction surface sucks the plurality of conductive sheets. A first end of each of the conductive sheets is disposed above a corresponding bonding pad. A second end of each of the conductive sheets is disposed above a corresponding welding pin, so that when the variable suction surface is pressed down, the first end of each of the conductive sheets is pressed onto the corresponding bonding pad, and the second end of each of the conductive sheets is pressed onto the corresponding welding pin.

The heating assembly is configured to heat the solders on the bonding pads and the solders on the welding pins, so that the first end of each of the conductive sheets is welded to the corresponding bonding pad, and the second end of each of the conductive sheets is welded and fixed to the corresponding welding pin.

Optionally, in some embodiments, the plurality of conductive sheets are conductive foils of a sheet structure.

Optionally, in some embodiments, the plurality of conductive sheets are connected to a conductive plate through weakening connecting structures. The plurality of conductive sheets and the conductive plate are in a same plane.

Optionally, in some embodiments, the vacuum suction movable assembly comprises a first fixing platform and a first power mechanism configured to drive the first fixing platform to move. A plurality of first vacuum suction heads and a plurality of second vacuum suction heads are elastically disposed on a lower surface of the first fixing platform. The plurality of first vacuum suction heads are one-to-one corresponding to the bonding pads on the substrate. Each of the first vacuum suction heads is configured to suck the first end of a corresponding conductive sheet. The plurality of second vacuum suction heads are one-to-one corresponding to the welding pins on the at least one chip. Each of the second vacuum suction heads is configured to suck the second end of a corresponding conductive sheet. Suction surfaces of the plurality of first vacuum suction heads and suction surfaces of the plurality of second vacuum suction heads form the variable suction surface of the vacuum suction movable assembly.

Optionally, in some embodiments, the vacuum suction movable assembly further comprises a plurality of pressing heads elastically disposed on the lower surface of the first fixing platform. At least one pressing head of the plurality of pressing heads is disposed between each of the first vacuum suction heads and a corresponding second vacuum suction head. Each of the first vacuum suction heads and the corresponding second vacuum suction head suck a same conductive sheet of the plurality of conductive sheets, so that when each of the pressing heads presses the corresponding conductive sheet under elastic force, a middle portion of the corresponding conductive sheet is bent.

Optionally, in some embodiments, the vacuum suction movable assembly comprises a second fixing platform and a second power mechanism configured to drive the second fixing platform to move. A third vacuum suction head is elastically mounted on a center of a lower surface of the second fixing platform. A plurality of first cylinders are elastically mounted on the lower surface of the second fixing platform. The plurality of first cylinders are disposed around the third vacuum suction head in an array. A distance between end faces of the plurality of first cylinders away from the second fixing platform and the lower surface of the second fixing platform is not less than a distance between a suction surface of the third vacuum suction head to the lower surface of the second fixing platform. The end faces of the plurality of first cylinders away from the second fixing platform form the variable suction surface of the vacuum suction movable assembly.

Optionally, in some embodiments, binders are disposed on the end faces of the plurality of first cylinders away from the sec and suction head fixing platform. The binders are configured to bond and fix the conductive plate when the third vacuum suction head sucks the conductive plate.

Optionally, in some embodiments, the vacuum suction movable assembly comprises a vacuum suction platform and a third power mechanism configured to drive the vacuum suction platform to move. A plurality of vacuum suction holes are disposed in an array on a lower surface of the vacuum suction platform. A plurality of second cylinders are elastically mounted on the lower surface of the vacuum suction platform.

Each of the second cylinders are correspondingly disposed between each two adjacent vacuum suction holes of the plurality of vacuum suction holes. End faces of the plurality of second cylinders away from the vacuum suction platform form the variable suction surface.

Alternatively, the end faces of the plurality of second cylinders away from the vacuum suction platform are one-to-one communicated with the plurality of vacuum suction holes, so that the end faces of the plurality of second cylinders away from the vacuum suction platform form the variable suction surface.

In a second aspect, the present disclosure provides a chip packaging method applied to the chip packaging device mentioned above.

The chip packaging method comprises:
providing the substrate and the at least one chip, where the at least one chip is fixedly disposed on the substrate, the bonding pads disposed around the at least one chip on the substrate are one-to-one corresponding to the welding pins on the at least one chip; the solders are disposed on each of the bonding pads and each of the welding pins;
sucking the plurality of conductive sheets through the variable suction surface of the vacuum suction movable assembly, where the first end of each of the conductive sheets is disposed above the corresponding bonding pad, and the second end of each of the conductive sheets is disposed above the corresponding welding pin;
pressing down the variable suction surface to press the first end of each of the conductive sheets onto the corresponding bonding pad, and to press the second end of each of the conductive sheets onto the corresponding welding pin; and
heating the solders on each of the bonding pads and the solders on each of the welding pins, by the heating assembly, so that the first end of each of the conductive sheets is welded to the corresponding bonding pad, and the second end of each of the conductive sheets is welded to the corresponding welding pin.

In a third aspect, the present disclosure provides a package chip. The package chip comprises a substrate and at least one chip fixed on the substrate. Welding pins are disposed on an upper surface of the at least one chip, bonding pads disposed on an upper surface of the substrate are disposed around the at least one chip. The bonding pads are one-to-one corresponding to the welding pins. Each of the welding pins is electrically connected to a corresponding bonding pad by a conductive sheet. Each conductive sheet is electrically connected between a corresponding bonding pad and a corresponding welding pin by the chip packaging method mentioned above, and the chip packaging method is executed by the chip packaging device mentioned above.

In the present disclosure, the vacuum suction movable assembly of the chip packaging device defines the variable suction surface, and the variable suction surface is a flat suction surface configured to suck the plurality of conductive sheets before being pressed down. The first end of each of the conductive sheets is disposed above the corresponding boding pad and the second end of each of the conductive sheets is disposed above the corresponding welding pin. The variable suction surface is deformed accordingly with a pressed surface after being pressed down, so that even the pressed surface comprises a plurality of surfaces of different heights, the variable suction surface is tightly attached to each of the surfaces of different heights of the pressed surface. Thus, when the variable suction surface is pressed down, the first end of each of the conductive sheets is pressed onto the corresponding bonding pad (disposed on the upper surface of the substrate), and the second end of each of the conductive sheets is pressed onto the corresponding welding pin (disposed on the upper surface of the at least one chip) corresponding to the corresponding bonding pad. Finally, the heating assembly heats the solders on the bonding pads and the solders on the welding pins, and then the first end of each of the conductive sheets is welded and fixed to the corresponding bonding pad and the second end of each of the conductive sheets is welded and fixed to the corresponding welding pin. A whole packaging process requires only one press-down process and one heating process, and the electrical interconnection between the at least one chip and the substrate is realized quickly through the plurality of conductive sheets. Meanwhile, the electrical interconnection between the at least one chip and the substrate is realized by welding the plurality of conductive sheets to the bonding pads of the substrate and the welding pins of the chip through the vacuum suction movable assembly, which is more efficient than the conventional lead bonding method and does not cause warping and cracking of the package chip during a hardware bonding process.

BRIEF DESCRIPTION OF DRAWINGS

Technical solutions of the present disclosure and characteristics thereof will be made obvious by following detailed description of specific embodiments of the present disclosure in conjunction with the accompanying drawings.

DETAILED DESCRIPTION

Technical solutions in the embodiments of the present disclosure will be clearly and completely described below in conjunction with the accompanying drawings in the embodiments of the present disclosure. Obviously, the described embodiments are only a part of the embodiments of the present disclosure, rather than all of the embodiments. Based on the embodiments of the present disclosure, all other embodiments obtained by those of ordinary skill in the art without creative work shall fall within the protection scope of the present disclosure. The following embodiments and technical features can be combined with each other without conflict.

In the semiconductor packaging industry, wire bonding refers to use of thin metal wires to achieve electrical interconnection between a chip and a substrate, by using heat, pressure, and ultrasonic energy, to tightly weld metal leads to the bonding pads of the substrate. Under ideal control conditions, electron sharing or atomic diffusion occurs between the metal leads and the substrate, resulting in atomic-level bonding between different metals. At present, a conventional chip package device adopts positive assembly to bond the bonding pads of the substrate to be packaged by bonding the metal leads. When performing such lead bonding method, metal leads of the chip are bonded to the bonding pads of the substrate one by one. Thus, packaging efficiency is low, and a bonding process thereof is prone to warping of the metal leads, cracking of the chip, and so on.

In view of this, it is necessary to provide a chip packaging solution to improve technical problems that a conventional chip packaging adopts a lead bonding method to realize electrical interconnection between a chip and a substrate, resulting in a low packaging efficiency, and resulting in warping of the metal leads, cracking of the chip, etc. during a bonding process.

Figure 1:
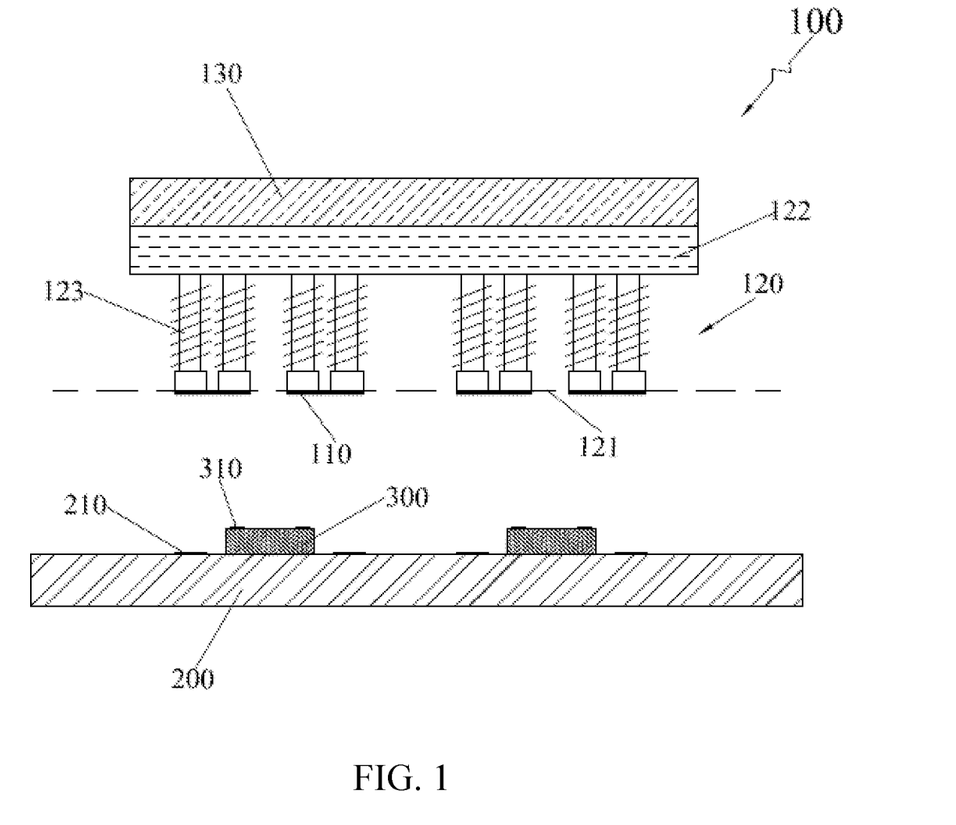
FIG. 1 is a structural schematic diagram of a chip packaging device according to a first embodiment of the present disclosure.
Figure 2:
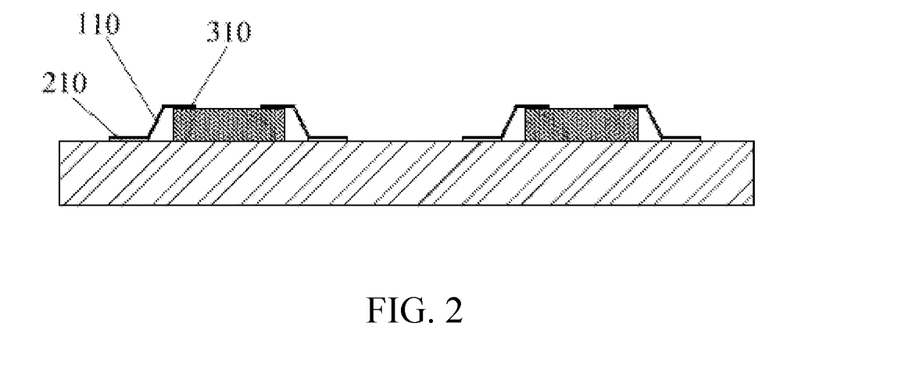
FIG. 2 is a structural schematic diagram showing that each of conductive sheets is welded on a substrate by the chip packaging device shown in FIG. 1.

In one embodiment, as shown in FIGS. 1 and 2, the present disclosure provides a chip packaging device 100 configured to bond solders on bonding pads 210 of a substrate 200 one to one to solders on welding pins 310 of at least one chip 300. The chip packaging device 100 comprises a plurality of conductive sheets 110, a vacuum suction movable assembly 120, and a heating assembly 130. The vacuum suction movable assembly 120 defines a variable suction surface 121. The variable suction surface 121 has an absorption function, so the variable suction surface 121 is configured to suck the plurality of conductive sheets 110. A first end of each of the conductive sheets 110 is disposed above a corresponding bonding pad 210. A second end of each of the conductive sheets 110 is disposed above a corresponding welding pin 310 corresponding to the corresponding bonding pad 210, so that when the variable suction surface 121 is pressed down, the first end of each of the conductive sheets 110 is pressed onto the corresponding bonding pad 210, and the second end of each of the conductive sheets 110 is pressed onto the corresponding welding pin 310. The heating assembly is configured to heat the solders on the bonding pads 210 and the solders on the welding pins 310, so that the first end of each of the conductive sheets 110 is welded to the corresponding bonding pad 210, and the second end of each of the conductive sheets 110 is welded and fixed to the corresponding welding pin 310. It should be noted that the solders on the bonding pad 210 and the solders on the welding pins 310 can be manually or additionally disposed on corresponding bonding pads 210 or corresponding welding pins 310 in advance through a tin tapping component (not shown in the drawings). The solders are generally made of tin, which can be heated and melted. After cooling, the first end of each of the conductive sheets 110 is welded to the corresponding bonding pad 210 through a corresponding solder on the corresponding bonding pad 210, and the second end of each of the conductive sheets 110 is welded to the corresponding welding pin 310 through a corresponding solder on the corresponding welding pin. A length of each of the conductive sheets 110 is greater than a sum of a length of the corresponding bonding pad 210 and a length of the corresponding welding pin 310. Generally, the length of each of the conductive sheets 110 is a sum of the length of the corresponding bonding pad 210 and a length of the corresponding welding pin 310 along an upper surface of the substrate 200, a corresponding side wall of the at least one chip 300 and an upper surface of the at least one chip 300. The number of the plurality of conductive sheets 110 sucked on the variable suction surface 121 is in correspondence with the plurality of bonding pads 210 on the substrate 200 to realize electrical interconnection between each of the bonding pads 210 and the corresponding welding pin 310 on the at least one chip by each of the conductive sheets 110. The variable suction surface 121 is a flat suction surface configured to suck the plurality of conductive sheets 110 before being pressed down. The first end of each of the conductive sheets is disposed above the corresponding boding pad and the second end of each of the conductive sheets is disposed above the corresponding welding pin. The variable suction surface 121 is deformed accordingly with a pressed surface after being pressed down, so that even the pressed surface comprises a plurality of surfaces of different heights, the variable suction surface 121 is tightly attached to each of the surfaces of different heights of the pressed surface. The variable suction surface 121 may be implemented in various forms as described in the subsequent embodiments, which is not described herein. The heating assembly 130 may specifically be a heating platform. As shown in FIG. 1, the heating assembly 130 is disposed on the vacuum suction movable assembly 120 to heat each of the solders on each of the bonding pads 210 and each of the solders on each of the welding pins 310 by heat conduction of the vacuum suction movable assembly 120. Alternatively, the heating assembly 130 is disposed below the substrate 200 to heat each of the solders on each of the bonding pads 210 and each of the solders on each of the welding pins 310 by heat conduction of the substrate 200. Thus, in the chip packaging device of the embodiment of the present disclosure, by arrangement of the variable suction surface 121 defined on the vacuum suction movable assembly 120, before being pressed down, the variable suction surface 121 sucks each of the conductive sheets 110 above the corresponding bonding pad 210 and the corresponding welding pin 310, and when the variable suction surface is pressed down, the first end of each of the conductive sheets 110 is pressed onto the corresponding bonding pad 210 (disposed on the upper surface of the substrate 200), and the second end of each of the conductive sheets 110 is pressed onto the corresponding welding pin 310 (disposed on the upper surface of the at least one chip). Finally, the heating assembly heats the solders on the bonding pads and the solders on the welding pins (as shown in FIG. 2), Finally, each of the solders on each of the bonding pads 210 and each of the solders on each of the welding pins 310 are heated by the heating assembly 130, so the first end of each of the conductive sheets 110 is welded and fixed to the corresponding bonding pad 210 and the second end of each of the conductive sheets 110 is welded and fixed to the corresponding welding pin 310. A whole packaging process requires only one press-down process and one heating process, and the electrical interconnection between the at least chip 300 and the substrate 200 is realized quickly through the plurality of conductive sheets 110. Meanwhile, the electrical interconnection between the at least one chip 300 and the substrate 200 is realized by welding the plurality of conductive sheets 110 to the bonding pads 210 of the substrate 200 and the welding pins 310 of the at least one chip 300 through the vacuum suction movable assembly 120, which is more efficient than the conventional lead bonding method and does not cause warping and cracking of the package chip during a hardware bonding process.

In some embodiments, the plurality of conductive sheets 110 are conductive foils of a sheet structure that is cut in advance. Alternatively, the plurality of conductive sheets 110 are conductive films of a sheet structure that is cut in advance. At this time, the variable suction surface 121 respectively sucks the plurality of conductive sheet 110, and the plurality of conductive sheets 110 is one-to-one corresponding to the plurality of bonding pads 210 on the substrate 200, so that each of the conductive sheets 110 is sucked above each of the bonding pads 210 and the corresponding welding pin 310. For different chip packaging methods, a shape of each of the conductive sheets 110 may be different, that is, the shape of each of the conductive sheets 110 is not limited to the rectangle as shown in the figures.

Since the plurality of conductive sheets 110 are generally thin, when each of the conductive sheets 110 is sucked, each of the conductive sheets 110 is prone to insufficient suction, resulting in some conductive sheets 110 falling off or deflecting. Therefore, in some embodiments, the plurality of conductive sheets 110 are connected to a conductive plate 140 through weakening connecting structures 10. The plurality of conductive sheets 110 and the conductive plate 140 are in a same plane.

Figure 3:
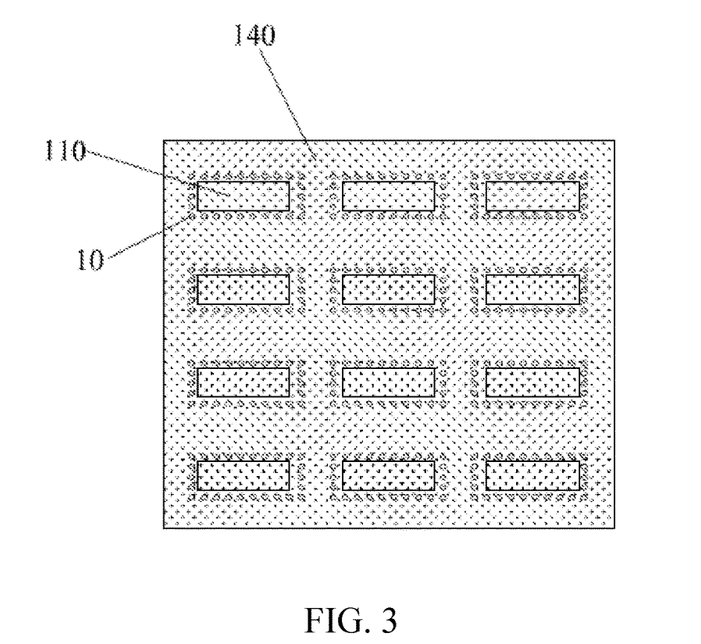
FIG. 3 is a structural schematic diagram of a conductive plate of the chip packaging device shown in FIG. 1.

Therefore, the variable suction surface 121 of the vacuum suction movable assembly 120 sucks each of the conductive sheets 110 above each of the bonding pads 210 and the corresponding welding pin 310 by sucking the conductive plate 140, thereby improving suction stability. In order to form the conductive plate 140 shown in FIG. 3, weaken processes are performed on a conductive foil or a conductive film, fine through holes are formed around each of the conductive sheets 110 on the conductive foil or the conductive film needed to form the plurality of conductive sheets 110 by laser, stamping, etching, or other processes. Therefore, corresponding weakening connecting structures 10 around each of the conductive sheets 110 are formed, and each of the conductive sheets 110 is connected to the conductive plate 140 by the corresponding weakening connecting structures 10, and the plurality of conductive sheets 110 and the conductive plate 140 are in the same plane. By arrangements of the weakening connecting structures 10, spacing surfaces on the conductive plate 140 are quickly separated from each of the conductive sheets 110, which avoids falling of the conductive sheets 110 when removing the conductive plate 140, and avoids cracking of the conductive sheets 110 when removing the conductive plate 140.

In some embodiments, the vacuum suction movable assembly 120 comprises a first fixing platform 122 and a first power mechanism (not shown in the drawings) configured to drive the first fixing platform 122 to move. A plurality of first vacuum suction heads 123 and a plurality of second vacuum suction heads 124 are elastically disposed on a lower surface of the first fixing platform 122. The plurality of first vacuum suction heads 123 are one-to-one corresponding to the bonding pads 210 on the substrate 200. Each of the first vacuum suction heads 123 is configured to suck the first end of a corresponding conductive sheet 110. The plurality of second vacuum suction heads 124 are one-to-one corresponding to the welding pins 310 on the at least one chip. Each of the second vacuum suction heads 124 is configured to suck the second end of a corresponding conductive sheet 110. Suction surfaces of the plurality of first vacuum suction heads 123 and suction surfaces of the plurality of second vacuum suction heads 124 form the variable suction surface 121 of the vacuum suction movable assembly.

Specifically, the heating assembly 130 is disposed on the vacuum suction movable assembly 120 to heat each of the solders on each of the bonding pads 210 and each of the solders on each of the welding pins 310 by heat conduction of the vacuum suction movable assembly 120. Specifically, the heating assembly 130 may be fixed on an upper surface of the first fixing platform 122, so when the first power mechanism drives the first fixing platform 122 to move, the plurality of first vacuum suction heads 123 and the plurality of second vacuum suction heads 124 are driven to move accordingly, and the heating assembly 130 is driven to move.

The plurality of first vacuum suction heads 123 and the plurality of second vacuum suction heads 124 may be elastically mounted on the lower surface of the first fixing platform 122 by springs or other elastic connecting structures. Before pressing down, the plurality of first vacuum suction heads 123 and the plurality of second vacuum suction heads 124 remain in a natural state because they are not subject to other external forces. The suction surfaces of the plurality of first vacuum suction heads 123 and the suction surfaces of the plurality of second vacuum suction heads 124 on the same plane (i.e., the variable suction surface 121), suck the plurality of conductive sheets 110. The first end of each of the conductive sheets 110 is sucked to a corresponding first vacuum suction head 123. The corresponding first vacuum suction head 123 is corresponding to the corresponding bonding pad 210 disposed on the substrate 200. The second end of each of the conductive sheets 110 is sucked to a corresponding second vacuum suction head 124. The corresponding second vacuum suction head 124 is corresponding to the corresponding welding pin 310 disposed on the at least one chip 300.

Since the upper surface of the at least one chip 300 is higher than the upper surface of the substrate 200, when the first power mechanism drives the first fixing platform 122 to press down to drive the plurality of first vacuum suction heads 123 and the plurality of second vacuum suction heads 124 to press down at the same time (i.e., the variable suction surface 121 is pressed down), each of the second vacuum suction heads 124 corresponding to each of the welding pins 310 is pressed on the second end of each of the conductive sheets. At this time, the variable suction surface 121 is not deformed. When the first power mechanism continues to drive the first fixing platform 122 to press down, the plurality of first vacuum suction heads 123 and the plurality of second vacuum suction heads 124 are driven to continuously press down at the same time (i.e., the variable suction surface 121 continues to press down), each of the second vacuum suction heads 124 corresponding to each of the welding pins 310 is blocked by the at least one chip 300, corresponding springs or corresponding elastic connecting structures of the plurality of second vacuum suction heads 124 are deformed, ensuring that the second end of each of the conductive sheets 110 is pressed onto the corresponding welding pin 310 by each of the second vacuum suction heads 124 without crushing the at least one chip 300.

Moreover, each of the first vacuum suction heads 123 corresponding to each of the bonding pads 210 presses the first end of each of the conductive sheets 110 onto the corresponding bonding pad 210 (i.e., the state shown in FIG. 2). At this time, the variable suction surface 121 deforms along with the pressed surface, which ensures that after the variable suction surface 121 is pressed down, the first end of each of the conductive sheets 110 is pressed onto the corresponding bonding pad 210, the second end of each of the conductive sheets 110 is pressed onto the corresponding welding pin 310. Finally, each of the solders on each of the bonding pads 210 and each of the solders on each of the welding pins 310 is heated by the heating assembly 130 through heat conduction.

Figure 4:
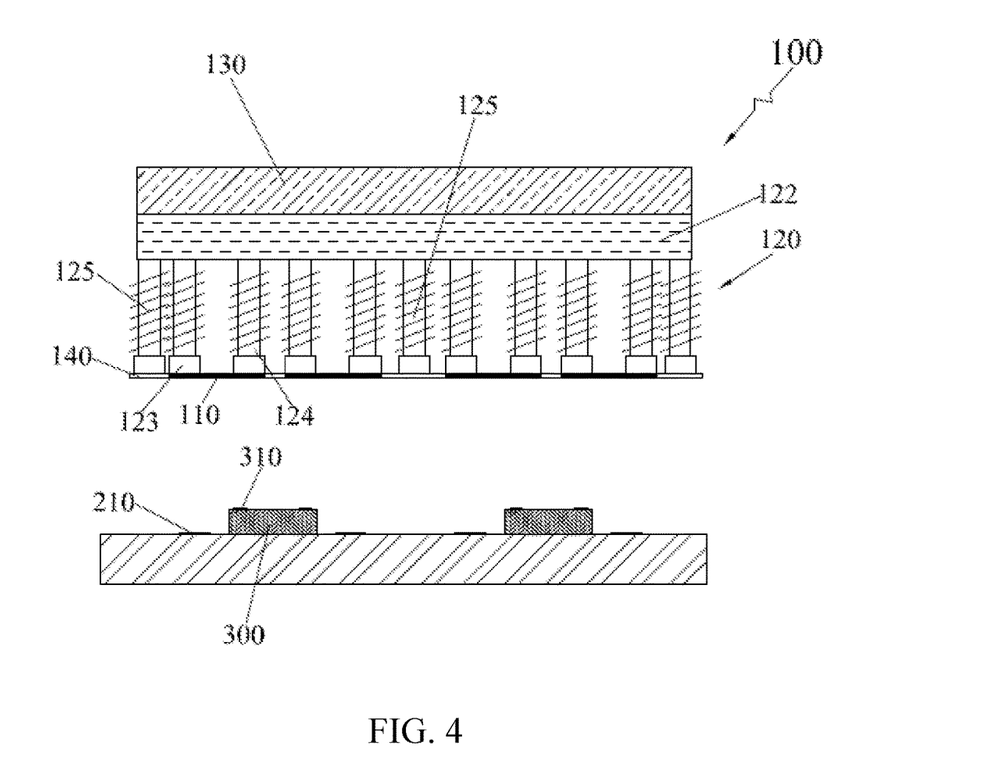
FIG. 4 is a structural schematic diagram of the chip packaging device according to a second embodiment of the present disclosure.

In the above embodiments, the plurality of first vacuum suction heads 123 and the plurality of second vacuum suction heads 124 either suck the plurality of conductive sheets 110 that are cut in advance as shown in FIG. 1 or suck the plurality of conductive sheets 110 defined on the conductive plate 140 as shown in FIG. 4. It is necessary to ensure that each of the first vacuum suction heads 123 sucks the first end of each of the conductive sheets 110 and each of the second vacuum suction heads 124 sucks the second end of each of the conductive sheets 110. As shown in FIG. 4, in order to further improve the suction stability of the conductive plate 140 defining the plurality of conductive sheets 110, when the plurality of first vacuum suction heads 123 and the plurality of second vacuum suction heads 124 suck the conductive plate 140, a plurality of auxiliary vacuum suction heads 125 are elastically disposed on the lower surface of the first fixing platform 122. The mounting method and structures of the plurality of auxiliary vacuum suction heads 125 are same as the plurality of first vacuum suction heads 123 and the plurality of second vacuum suction heads 124. The plurality of auxiliary vacuum suction heads 125 are configured to suck rest portions of the conductive plate 140 except for the plurality of conductive sheets 110, which further improves the suction stability of the conductive plate 140.

Figure 5:
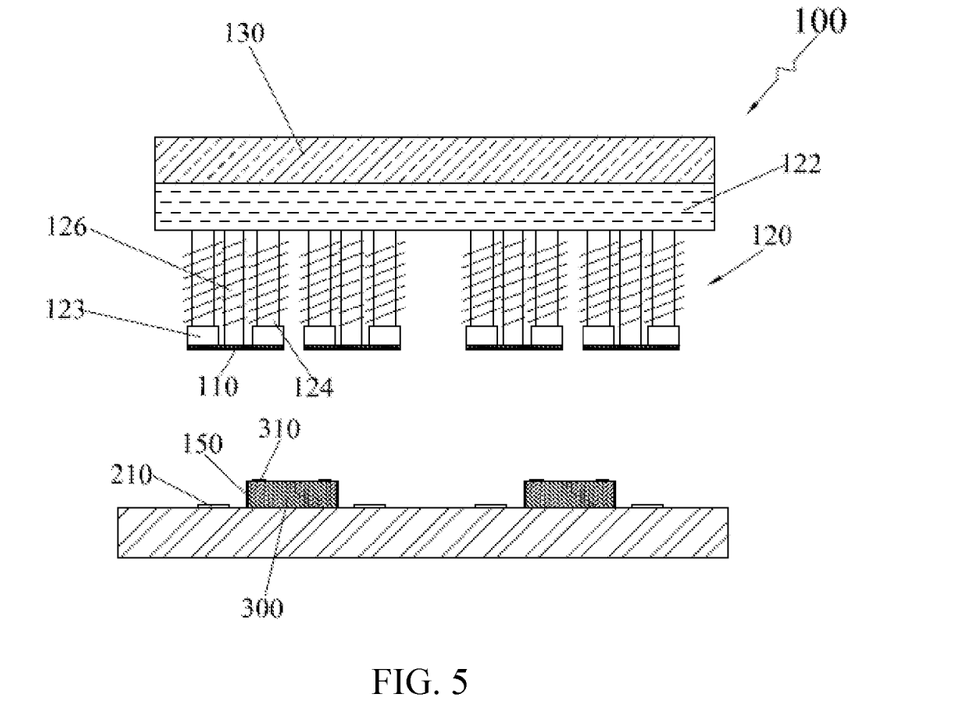
FIG. 5 is a structural schematic diagram of the chip packaging device according to a third embodiment of the present disclosure.
Figure 6:
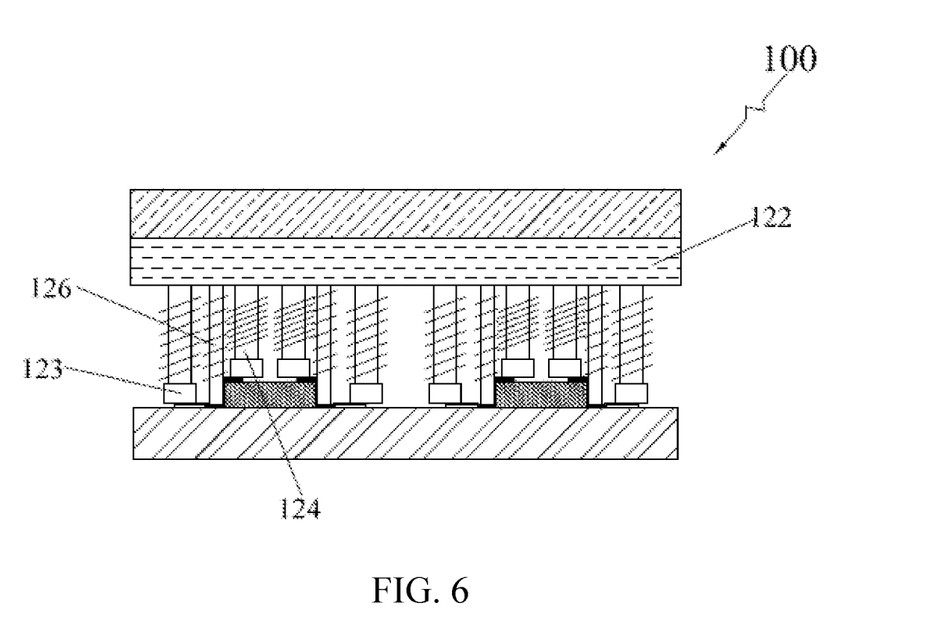
FIG. 6 is a structural schematic diagram of the chip packaging device shown in FIG. 5 and in a working state.
Figure 7:
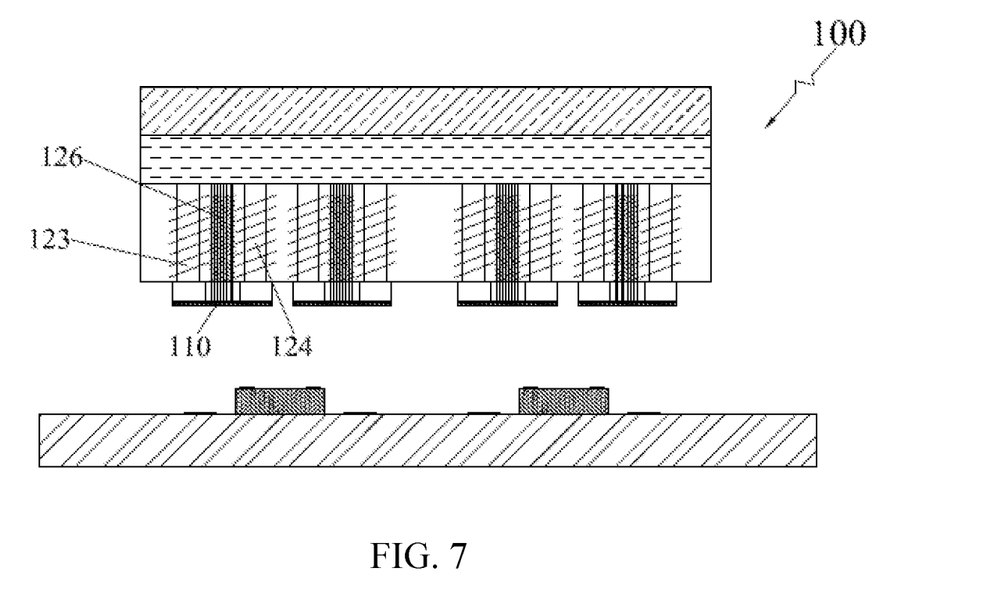
FIG. 7 is a structural schematic diagram of the chip packaging device according to a fourth embodiment of the present disclosure.

In the embodiment, as shown in FIG. 2, when the first end of each of the conductive sheets 110 is pressed onto the corresponding bonding pad 210, and the second end of each of the conductive sheets 110 is pressed onto the corresponding welding pin 310, the middle portion of each of the conductive sheets is in a suspended state. In a subsequent gluing and packaging process, since two ends of each of the conductive sheets 110 are fixed, and each of the conductive sheets 110 is thin, so filling glue is not well supported by each of the conductive sheets 110, and the plurality of conductive sheets 110 are easy to break, which leads to short circuit of part of the at least one chip 300. Therefore, as shown in FIGS. 5 and 6, in some embodiments, the vacuum suction movable assembly 120 further comprises a plurality of pressing heads 126 elastically disposed on the lower surface of the first fixing platform. At least one pressing head 126 of the plurality of pressing heads is disposed between each of the first vacuum suction heads and a corresponding second vacuum suction head that sucking a same conductive sheet 110, so that when each of the pressing heads 126 presses the corresponding conductive sheet 110 under elastic force, the middle portion of the corresponding conductive sheet is attached to the at least one chip 300 or the middle portion of the corresponding conductive sheet is bent (specifically, the middle portion of each of the conductive sheets 110 may be bent at the same level as a side surface of the at least one chip 300). Specifically, when only one pressing head 126 is disposed between each of the first vacuum suction heads 123 and the corresponding second vacuum suction head 124 that sucking the same conductive sheet 110, each of the pressing heads 126 is a cylindrical head, and each of the pressing heads is disposed directly facing a gap between each of the bonding pads 210 and the at least one chip 300. Therefore, after being pressed down, each of the first vacuum suction heads 123 presses the first end of each of the conductive sheets 110 onto the corresponding bonding pad 210 and each of the second vacuum suction heads 124 presses the second end of each of the conductive sheets 110 to the corresponding welding pin 310. Each of the pressing heads 126 presses the middle portion of each of the conductive sheets 110 to the corresponding side wall of the at least one chip 300 (as shown in FIG. 6) or makes the middle portion of each of the conductive sheets 110 bend (as shown in FIG. 7). When pressing heads 126 of the plurality of pressing heads 126 are disposed between each of the first vacuum suction heads 123 and the corresponding second vacuum suction head 124 that sucking the same conductive sheet 110, each of the pressing heads 126 is a specific small size cylindrical head, and the pressing heads 126 are disposed in an array between each of the first vacuum suction heads 123 and the corresponding second vacuum suction head 124. In this way, the pressing heads 126 disposed in the array adapt to the at least one chip having different sizes. each of the pressing heads 126 makes adaptive adjustment according to the pressed surface, making the middle portion of each of the conductive sheets 110 well fit the corresponding side wall of the at least one chip 300 or making the middle portion of each of the conductive sheets 110 bend.

Based on the above embodiments, it is clear that the plurality of conductive sheets 110 are either the conductive foils or the conductive films. When the plurality of conductive sheets 110 are the conductive foils, because the conductive foils are inflexible and unable to be restored to an original shape after being stressed, the middle portion of each of the conductive sheets 110 is always attached to the corresponding side wall of the at least one chip 300 after being pressed by the pressing heads 126. Even if the corresponding pressing heads 126 are withdrawn, the middle portion of each of the conductive sheets 110 is still attached to the corresponding side wall of the at least one chip 300 or remains in the same level with the side surface of the at least one chip 300.

However, when the plurality of conductive sheets 110 are the conductive films, because the conductive films are mainly made of polymer and are flexible, the conductive films would return to an original state after an external force disappears. Therefore, as shown in FIG. 5, after the plurality of pressing heads 126 are withdrawn, in order to ensure that the middle portion of each of the conductive sheets pressed onto the corresponding side wall of the at least one chip 300 by the corresponding pressing head 126 remains attaching to the corresponding side wall of the at least one chip 300, the chip packaging device 100 further comprises adhesive layers 150 disposed on side walls of the at least one chip 300. Each of the adhesive layers 150 is disposed on a corresponding side wall between each of the bonding pads 210 and the corresponding welding pin 310, so the middle portion of each of the conductive sheets 110 is further attached to the corresponding side wall of the at least one chip 300 when the corresponding pressing head 126 elastically presses the corresponding conductive sheet 110. Therefore, by arrangements of the adhesive layers 150, when the plurality of conductive sheets 110 are the conductive films, the middle portion of each of the conductive sheets does not return to the original state when the external force disappears, and when the plurality of conductive sheets 110 are the conductive foils, a fit degree between the middle portion of each of the conductive sheets and the corresponding side wall of the at least one chip 300 is enhanced.

Figure 8:
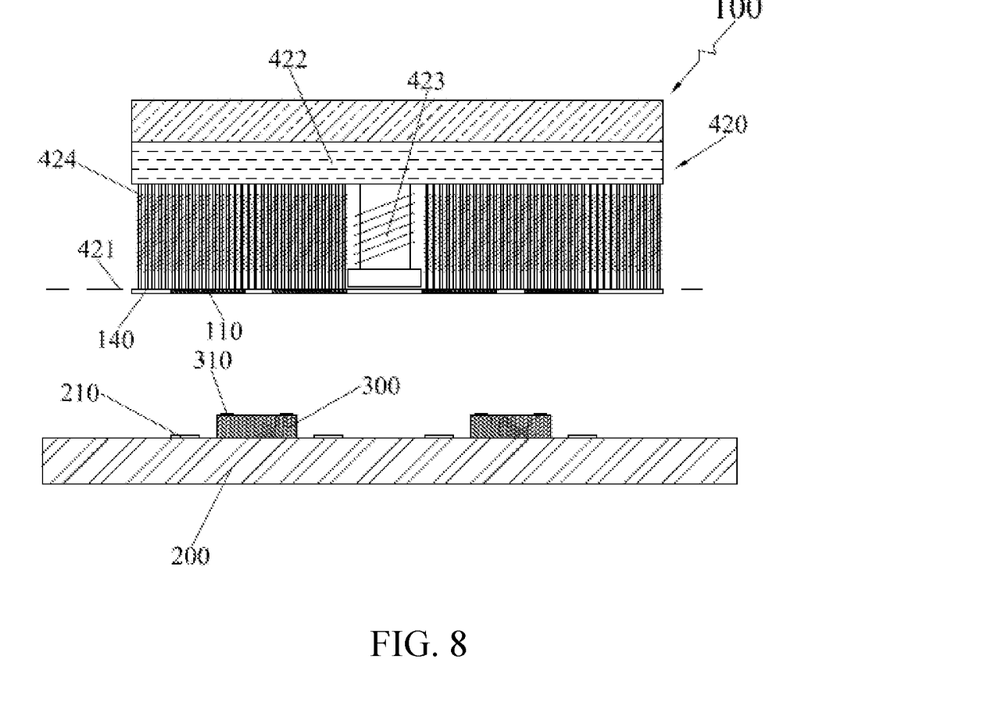
FIG. 8 is a structural schematic diagram of the chip packaging device according to a fifth embodiment of the present disclosure.

In some embodiments, as shown in FIG. 8, the vacuum suction movable assembly 420 specifically comprises following structures, i.e., a second fixing platform 422 and a second power mechanism (not shown in the drawings) configured to drive the second fixing platform 422 to move. A third vacuum suction head 423 is elastically mounted on a center of a lower surface of the second fixing platform 422. A plurality of first cylinders 424 are elastically mounted on the lower surface of the second fixing platform 422. The plurality of first cylinders 424 are disposed around the third vacuum suction head 423 in an array. A distance between end faces of the plurality of first cylinders 424 away from the second fixing platform 422 and the lower surface of the second fixing platform 422 is not less than a distance between a suction surface of the third vacuum suction head 423 to the lower surface of the second fixing platform 422. The end faces of the plurality of first cylinders 424 away from the second fixing platform 422 form the variable suction surface 421 of the vacuum suction movable assembly 420.

Specifically, the third vacuum suction head 423 is a large vacuum suction head whose suction force is distributed to the end surfaces of the plurality of first cylinders 424 away from the second fixing platform 422. The third vacuum suction head 423 and the plurality of first cylinders 424 are elastically mounted on the lower surface of the second fixing platform 422 by springs or other elastic connecting structures, so that before the third vacuum suction head 423 and the plurality of first cylinders 424 are pressed down, the plurality of first cylinders 424 remain in a natural state because no external force is applied. At this time, the end surfaces of the plurality of first cylinders 424 away from the second fixing platform 422 are disposed on a same plane (i.e., the variable suction surface 421). The end surfaces of the plurality of first cylinders 424 suck the plurality of conductive sheets 110 (specifically, the plurality of conductive sheets 110 cut in advance are sucked, or the conductive plate 140 defining the plurality of conductive sheets 110 is sucked).

Since the upper surface of the at least one chip 300 is higher than the upper surface of the substrate 200, when the second power mechanism drives the second fixing platform 422 down to simultaneously drive the plurality of first cylinders 424 to press down (i.e., the variable suction surface 421 is pressed down), the plurality of first cylinders 424 disposed corresponding to the upper surface of the at least one chip 300 press the second end of each of the conductive sheets 110 onto the corresponding welding pin. At this time, the variable suction surface 421 is not deformed, and when the second power mechanism continues to drive the second fixing platform 422 down to simultaneously drive the plurality of first cylinders 424 to continue to press down (i.e., the variable suction surface 421 continues to press down), the plurality of first cylinders 424 disposed on the upper surface of the at least one chip 300 are blocked by the at least one chip 300, and the springs or elastic connecting structures thereof elastically deformed accordingly. so when the plurality of first cylinders 424 press the second end of each of the conductive sheets 110 onto the corresponding welding pin 310, the at least one chip 300 is not damaged. At the same time, the plurality of first cylinders 424 corresponding to the upper surface of the substrate 200 (i.e., the rest portions of the substrate 200 except the at least one chip 300) press the first end of each of the conductive sheets 110 onto the corresponding bonding pad 210 and press the middle portion of each of the conductive sheets 110 onto the corresponding side wall of the at least one chip 300. At this time, the variable suction surface 421 deforms along with the pressed surface, ensuring that after the variable suction surface 421 is pressed down, the first end of each of the conductive sheets 110 is pressed onto the corresponding bonding pad 210, and the second end of each of the conductive sheets is pressed onto the corresponding welding pin 310.

In the above embodiment only one third vacuum suction head 423 is fixed on the center of the lower surface of the second fixing platform 422, so that the suction force formed in the variable suction surface 421 decreases from a center to a periphery thereof. When the variable suction surface 421 sucks the conductive plate 140 defining the plurality of conductive sheets 110, the conductive structure 140 may not fit tightly to the end faces of corresponding first cylinders 424 due to insufficient suction force on a perimeter of the conductive plate 140. In view of this, binders are disposed on the end faces of the plurality of first cylinders 424 away from the second fixing platform 422. The binders are configured to bond and fix the conductive plate 140 when the third vacuum suction head 423 sucks the conductive plate 140, which ensures that the perimeter of the conductive plate 140 does not move due to insufficient suction. Further, the binders may be disposed on corresponding end faces of some first cylinders 424 corresponding to the perimeter of the conductive plate 140. The binders can be glue or a high temperature resistant adhesive film. When the binders are glue, the glue is separately applied to the corresponding end surfaces of some first cylinders 424. When the binders are a high temperature resistant adhesive film, the high temperature resistant adhesive film is attached to the corresponding end surfaces of some first cylinders 424. That is, a first surface of the high temperature resistant adhesive film is bonded to the corresponding end surfaces of some first cylinders 424, and a second surface of the high-temperature adhesive film is bonded to the conductive plate 140.

Figure 9:
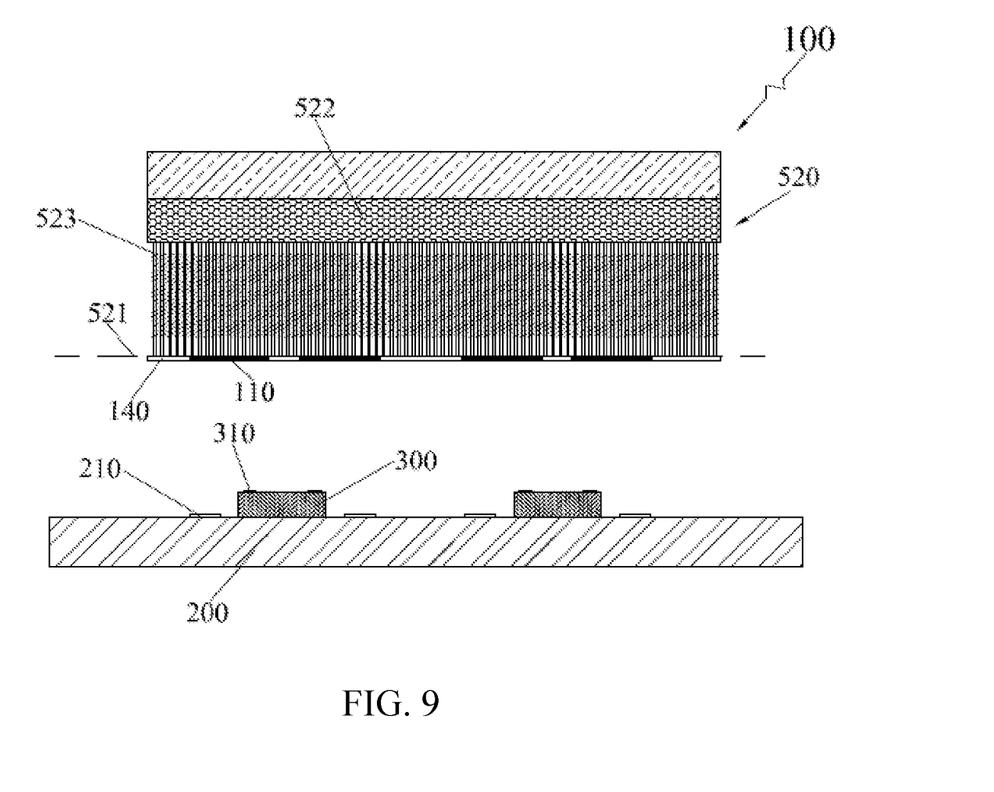
FIG. 9 is a structural schematic diagram of the chip packaging device according to a sixth embodiment of the present disclosure.

In some embodiments, as shown in FIG. 9, the vacuum suction movable assembly 520 may be specifically disposed as follow. Namely, the vacuum suction movable assembly 520 comprises a vacuum suction platform 522 and a third power mechanism (not shown in the drawings) configured to drive the vacuum suction platform 522 to move. A plurality of vacuum suction holes (not shown in the drawings) are disposed in an array on a lower surface of the vacuum suction platform 522. A plurality of second cylinders 523 are elastically mounted on the lower surface of the vacuum suction platform 522. Each of the second cylinders 523 are correspondingly disposed between each two adjacent vacuum suction holes of the plurality of vacuum suction holes. End faces of the plurality of second cylinders away from the vacuum suction platform form the variable suction surface 521. Alternatively, the end faces of the plurality of second cylinders 523 away from the vacuum suction platform 522 are one-to-one communicated with the plurality of vacuum suction holes, so that the end faces of the plurality of second cylinders 523 away from the vacuum suction platform 522 form the variable suction surface 521. Therefore, the suction force of the vacuum suction platform 522 is uniformly distributed to each of the end faces of each of the second cylinders 523 away from the vacuum suction platform 522. The plurality of second cylinders 523 may be elastically mounted on the lower surface of the vacuum suction platform 522 by springs or other elastic connecting structures, and a principle of forming of the variable suction surface 521 can be referred to a principle of forming of the variable suction surface by the plurality of first cylinders 424, which is not repeated herein.

Figure 10:
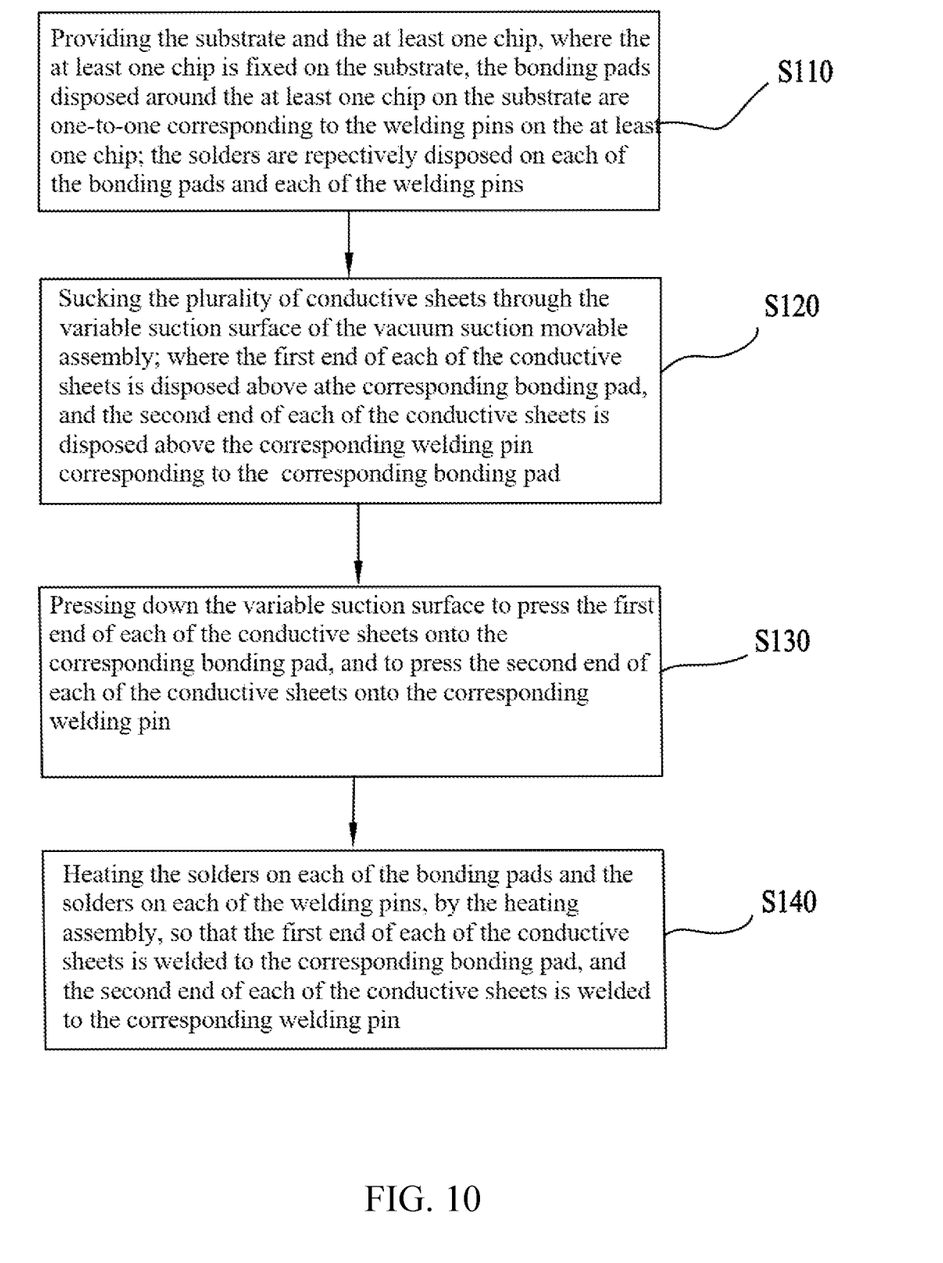
FIG. 10 is a flow chart of a chip packing method according to one embodiment of the present disclosure.

In one embodiment, as shown in FIG. 10, the present disclosure provides a chip packaging method applied to the chip packaging device 100 mentioned above. The chip packaging method comprises:

Step S110: providing the substrate and at least one chip, wherein the at least one chip is fixedly disposed on the substrate, the bonding pads disposed around the at least one chip on the substrate are one-to-one corresponding to the welding pins on the at least one chip; the solders are disposed on each of the bonding pads and each of the welding pins;

Specifically, as shown in FIG. 1, the substrate 200 and at least one chip 300 are provided, and the substrate 200 is selected from a silicon substrate, a ceramic substrate, and a flexible substrate. The at least one chip 300 is selected from a memory chip, a control chip, a power chip, and an optical chip. The at least one chip 300 is fixed on the substrate 200. The at least one chip 300 is fixedly disposed on the substrate 200. The bonding pads 210 disposed around the at least one chip 300 on the substrate 200 are one-to-one corresponding to the welding pins 310 on the at least one chip 300. The solders (not shown in the drawings) are disposed on each of the bonding pads 210 and each of the welding pins 310. The solders on the bonding pads 210 and the solders on the welding pins 310 can be manually or additionally disposed on corresponding bonding pads 210 or corresponding welding pins 310 in advance through the tin tapping component (not shown in the drawings). The solders are generally made of tin, which can be heated and melted and is cooled to solidify for fixing.

Step S120: sucking the plurality of conductive sheets through the variable suction surface of the vacuum suction movable assembly; wherein the first end of each of the conductive sheets is disposed above the corresponding bonding pad, and the second end of each of the conductive sheets is disposed above the corresponding welding pin;

Specifically, as shown in FIGS. 1 and 2, the plurality of conductive sheets 110 are sucked through the variable suction surface 121 of the vacuum suction movable assembly 120. The first end of each of the conductive sheets 110 is disposed above the corresponding bonding pad 210, and the second end of each of the conductive sheets 110 is disposed above the corresponding welding pin 310 corresponding to the corresponding bonding pad 210. Based on the above description, it is noted that based on the specific structure of the vacuum suction movable assembly 120, ways of the variable suction surface 121 sucking the plurality of conductive sheets 110 are slightly different, which can be referred to the description of the embodiments mentioned above and are not repeated herein.

Step S130: pressing down the variable suction surface to press the first end of each of the conductive sheets onto the corresponding bonding pad, and to press the second end of each of the conductive sheets onto the corresponding welding pin; and Specifically, as shown in FIGS. 1 and 2, the variable suction surface 121 is pressed down to press the first end of each of the conductive sheets 110 onto the corresponding bonding pad 210, and is pressed down to press the second end of each of the conductive sheets 110 onto the corresponding welding pin. Based on the above description, it is noted that based on the specific structure of the vacuum suction movable assembly 120, ways of pressing down the variable suction surface 121 to press the first end of each of the conductive sheets 110 onto the corresponding bonding pad 210 and press the second end of each of the conductive sheets 110 onto the corresponding welding pin are slightly different, which can be referred to the description of the embodiments mentioned above and are not repeated herein.

Step S140: heating the solders on each of the bonding pads and the solders on each of the welding pins, by the heating assembly, so that the first end of each of the conductive sheets is welded to the corresponding bonding pad, and the second end of each of the conductive sheets is welded to the corresponding welding pin.

Specifically, when the first end of each of the conductive sheets 110 is pressed onto the corresponding bonding pad 210 and the second end of each of the conductive sheets 110 is pressed onto the corresponding welding pin by the steps mention above, the solders on each of the bonding pads 210 and the solders on each of the welding pins are heated by the heating assembly 130, so that the first end of each of the conductive sheets is welded to the corresponding bonding pad, and the second end of each of the conductive sheets is welded to the corresponding welding pin.

The heating assembly 130 may specifically be the heating platform. As shown in FIG. 1, the heating assembly 130 is disposed on the vacuum suction movable assembly 120 to heat each of the solders on each of the bonding pads 210 and each of the solders on each of the welding pins 310 by heat conduction of the vacuum suction movable assembly 120. Alternatively, the heating assembly 130 is disposed below the substrate 200 to heat each of the solders on each of the bonding pads 210 and each of the solders on each of the welding pins 310 by heat conduction of the substrate 200.

Thus, in the chip packaging method of the embodiment of the present disclosure, the whole packaging process requires only one press-down process and one heating process, and the electrical interconnection between the at least chip 300 and the substrate 200 is realized quickly through the plurality of conductive sheets 110. Meanwhile, the electrical interconnection between the at least one chip 300 and the substrate 200 is realized by welding the plurality of conductive sheets 110 to the bonding pads 210 of the substrate 200 and the welding pins 310 of the at least one chip 300 through the vacuum suction movable assembly 120, which is more efficient than the conventional lead bonding method and does not cause warping and cracking of the package chip during the hardware bonding process.

Figure 11:
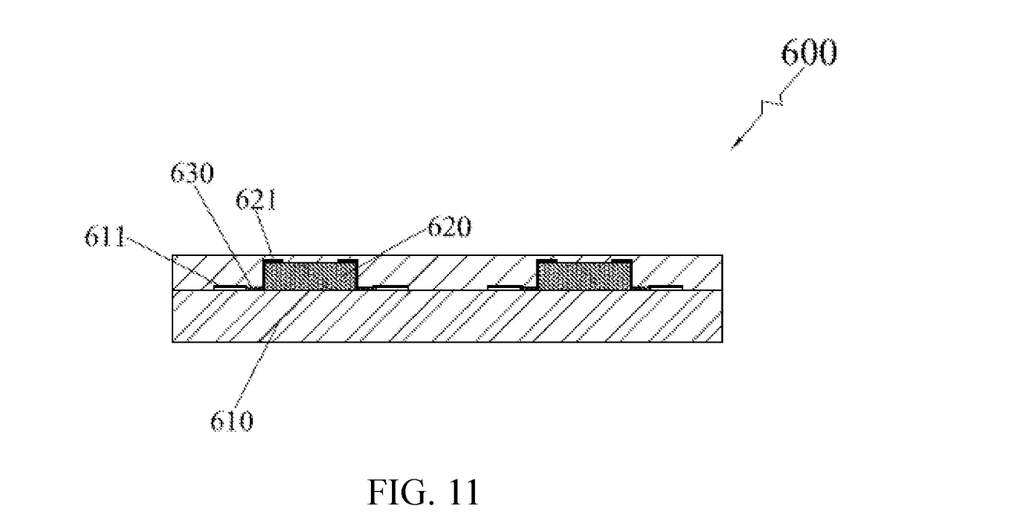
FIG. 11 is a structural schematic diagram of a package chip according to one embodiment of the present disclosure.

As shown in FIG. 11, in one embodiment, the present disclosure provides a package chip 600. The package chip comprises a substrate 610 and chips 620 fixed on the substrate 610. Welding pins 621 are disposed on an upper surface of the chips 620, bonding pads 611 disposed on an upper surface of the substrate 610 are disposed around the chips. The bonding pads 611 are one-to-one corresponding to the welding pins 621. Each of the welding pins is electrically connected to a corresponding bonding pad by a conductive sheet 630. Each conductive sheet 630 is electrically connected between a corresponding bonding pad 611 and a corresponding welding pin 621 by the chip packaging method mentioned above that is executed by the chip packaging device mentioned above.

Therefore, the electrical interconnection between the chips 620 and the substrate 610 is realized by the plurality of conductive sheets 630, which is more efficient than the conventional lead bonding method and does not cause warping and cracking of the package chip during the hardware bonding process.

Although the present disclosure has been shown and described according to one or more embodiments, equivalent variations and modifications can be made by those skilled in the art based on a reading and understanding of the specification and the accompanying drawings. The present disclosure includes all these modifications and variants and is limited only by the scope of the appended claims. In particular with respect to the various functions performed by the above assemblies, terms used to describe such assemblies are intended to correspond to any component (unless otherwise indicated) that performs the specified function of the assemblies (e.g., which is functionally equivalent), even if the component is not equivalent to the disclosed structure that performs the function in the exemplary embodiments of the present specification shown herein in structure.

That is, the above mentioned are only the embodiments of the present disclosure and are not intended to limit the protection scope of the present disclosure. Any equivalent structure or equivalent process transformation according to the specification and the accompanying drawings of the present disclosure, such as the combination of technical features between embodiments, or direct or indirect applications in other related technical fields, should be included in the protection scope of the present disclosure similarly.

In addition, it should be understood that in the description of the present disclosure terms such as "central", "lateral", "lengthways", "length", "width", "thickness", "upper", "lower", "front", "rear", "left", "right", "vertical", "horizontal", "top", "bottom", "inner", "outer", etc. indicate direction or position relationships shown based on the drawings, and are only intended to facilitate the description of the present disclosure and the simplification of the description rather than to indicate or imply that the indicated device or element must have a specific direction or constructed and operated in a specific direction, and therefore, shall not be understood as a limitation to the present disclosure. In addition, for structural elements with the same or similar characteristics may be marked with the same or different markings in the present disclosure. In addition, terms such as "first" and "second" are only used for the purpose of description, rather than being understood to indicate or imply relative importance or hint the number of indicated technical features. Thus, the feature limited by "first" and "second" can explicitly or impliedly include one or more features. In the description of the present disclosure, the meaning of "a plurality of" is two or more unless otherwise specified.

In the present disclosure, the word "exemplary" means "used as an example, illustration, or description". Any one embodiment described as "exemplary" embodiment in the present disclosure is not necessarily to be construed as being more preferred or advantageous than other embodiments. The foregoing description is given for the purpose of enabling any person skilled in the art to implement and use the present disclosure. In the above description, various details are set forth for the purpose of explanation. It should be understood that those skilled in the art can realize that the present disclosure can be implemented without using these particular details. In other embodiments, structures and processes that are well known are not elaborated upon to avoid unnecessary details that would obscure the description of the present disclosure. Accordingly, the present disclosure is not intended to be limited to the embodiments shown above, but rather to be consistent with the broadest scope of principles and features disclosed in the present disclosure.

What is claimed is:

1. A chip packaging device configured to bond solders on bonding pads of a substrate one to one to solders on welding pins of at least one chip, comprising:
    a plurality of conductive sheets;
    a vacuum suction movable assembly; and
    a heating assembly;
    wherein the vacuum suction movable assembly defines a variable suction surface; the variable suction surface is configured to suck the plurality of conductive sheets; a first end of each of the conductive sheets is disposed above a corresponding bonding pad; a second end of each of the conductive sheets is disposed above a corresponding welding pin so that when the variable suction surface is pressed down, the first end of each of the conductive sheets is pressed onto the corresponding bonding pad, and the second end of each of the conductive sheets is pressed onto the corresponding welding pin;
    wherein the heating assembly is configured to heat the solders on the bonding pads and the solders on the welding pins, so that the first end of each of the conductive sheets is welded to the corresponding bonding pad, and the second end of each of the conductive sheets is welded and fixed to the corresponding welding pin.

2. The chip packaging device according to claim 1, wherein the plurality of conductive sheets are conductive foils of a sheet structure.

3. The chip packaging device according to claim 1, wherein the plurality of conductive sheets are connected to a conductive plate through weakening connecting structures; the plurality of conductive sheets and the conductive plate are in a same plane.

4. The chip packaging device according to claim 1, wherein the vacuum suction movable assembly comprises a first fixing platform and a first power mechanism configured to drive the first fixing platform to move; a plurality of first vacuum suction heads and a plurality of second vacuum suction heads are elastically disposed on a lower surface of the first fixing platform; the plurality of first vacuum suction heads are one-to-one corresponding to the bonding pads on the substrate; each of the first vacuum suction heads is configured to suck the first end of a corresponding conductive sheet; the plurality of second vacuum suction heads are one-to-one corresponding to the welding pins on the at least one chip; each of the second vacuum suction heads is configured to suck the second end of a corresponding conductive sheet; suction surfaces of the plurality of first vacuum suction heads and suction surfaces of the plurality of second vacuum suction heads form the variable suction surface of the vacuum suction movable assembly.

5. The chip packaging device according to claim 4, wherein the vacuum suction movable assembly further comprises a plurality of pressing heads elastically disposed on the lower surface of the first fixing platform; at least one pressing head of the plurality of pressing heads is disposed between each of the first vacuum suction heads and a corresponding second vacuum suction head, and each of the first vacuum suction heads and the corresponding second vacuum suction head suck a same conductive sheet of the plurality of conductive sheets, so that when each of the pressing heads presses the corresponding conductive sheet under elastic force, a middle portion of the corresponding conductive sheet is bent.

6. The chip packaging device according to claim 3, wherein the vacuum suction movable assembly comprises a second fixing platform and a second power mechanism configured to drive the second fixing platform to move; a third vacuum suction head is elastically mounted on a center of a lower surface of the second fixing platform; a plurality of first cylinders are elastically mounted on the lower surface of the second fixing platform; the plurality of first cylinders are disposed around the third vacuum suction head in an array; a distance between each of end faces of the plurality of first cylinders away from the second fixing platform and the lower surface of the second fixing platform is not less than a distance between a suction surface of the third vacuum suction head and the lower surface of the second fixing platform; the end faces of the plurality of first cylinders away from the second fixing platform form the variable suction surface of the vacuum suction assembly.

7. The chip packaging device according to claim 6, wherein binders are disposed on the end faces of the plurality of first cylinders away from the second fixing platform; the binders are configured to bond and fix the conductive plate when the third vacuum suction head sucks the conductive plate.

8. The chip packaging device according to claim 1, wherein the vacuum suction movable assembly comprises a vacuum suction platform and a third power mechanism configured to drive the vacuum suction platform to move; a plurality of vacuum suction holes are disposed in an array on a lower surface of the vacuum suction platform; a plurality of second cylinders are elastically mounted on the lower surface of the vacuum suction platform;

wherein each of the second cylinders is correspondingly disposed between each two adjacent vacuum suction holes of the plurality of vacuum suction holes; end faces of the plurality of second cylinders away from the vacuum suction platform form the variable suction surface; or, the end faces of the plurality of second cylinders away from the vacuum suction platform are one-to-one communicated with the plurality of vacuum suction holes, so that the end faces of the plurality of second cylinders away from the vacuum suction platform form the variable suction surface.

\* \* \* \* \*